United States Patent
Refaat et al.

(10) Patent No.: US 10,996,102 B2
(45) Date of Patent: May 4, 2021

(54) FAST AND PRECISE WAVELENGTH AND POWER MEASUREMENTS TECHNIQUE FOR CONTINUOUS WAVE, MODULATED, AND PULSED MONOCHROMATIC RADIATION

(71) Applicant: U.S.A. AS REPRESENTED BY THE ADMINISTRATOR OF NASA, Washington, DC (US)

(72) Inventors: Tamer Refaat, Hampton, VA (US); Mulugeta Petros, Newport News, VA (US); Upendra N. Singh, Yorktown, VA (US)

(73) Assignee: UNITED STATES OF AMERICA AS REPRESENTED BY THE ADMINISTRATOR OF NASA, Washington, DC (US)

( * ) Notice: Subject to any disclaimer, the term of this patent is extended or adjusted under 35 U.S.C. 154(b) by 227 days.

(21) Appl. No.: 15/982,359

(22) Filed: May 17, 2018

(65) Prior Publication Data
US 2019/0353516 A1 Nov. 21, 2019

(51) Int. Cl.
*G01J 1/02* (2006.01)
*G01J 1/42* (2006.01)
(Continued)

(52) U.S. Cl.
CPC ........... *G01J 1/0252* (2013.01); *G01J 1/0407* (2013.01); *G01J 1/42* (2013.01); *G01J 3/0205* (2013.01); *G01J 3/28* (2013.01); *H01L 31/0264* (2013.01)

(58) Field of Classification Search
CPC .......... G01J 1/0252; G01J 1/0407; G01J 1/42; G01J 3/0205; G01J 3/28; H01L 31/0264
See application file for complete search history.

(56) References Cited

U.S. PATENT DOCUMENTS

| | | | | |
|---|---|---|---|---|
| 5,518,934 A | * | 5/1996 | Forrest | H01L 27/14649 117/56 |
| 2009/0154506 A1 | * | 6/2009 | Koyama | H01S 5/06825 372/20 |
| 2011/0255075 A1 | * | 10/2011 | Kerstan | G01J 3/02 356/72 |

OTHER PUBLICATIONS

Singh, Upendra N. et al., "Triple-Pulsed integrated Path Differential Absorption Lidar for Carbon Dioxid Measurement—Novel Lider Technologies and Techniques with Path to Space," Conference paper, 2017, 4 pages.

(Continued)

*Primary Examiner* — Hina F Ayub
(74) *Attorney, Agent, or Firm* — Shawn P. Gorman; Jonathan B. Soike; Helen M. Galus

(57) ABSTRACT

Systems, methods, and devices of the various embodiments may provide a fast and precise methods for continuously monitoring and measuring the absolute wavelength of monochromatic radiation sources, such as lasers, etc., irrespective of the temporal profile of the source (i.e., continuous wave, modulated, or pulsed). Radiation power measurement may also be enabled by the various embodiment methods. The various embodiment methods may utilize high-speed low-noise detection to enable fast and accurate measurements. High-precision wavelength and power measurement may be achieved in the various embodiments to monitor radiation source jitters and fluctuations, without relying on frequency transforms or dispersive optics. Both wavelength and power may be measured simultaneously or sequentially in various embodiments.

20 Claims, 6 Drawing Sheets

(51) Int. Cl.
*H01L 31/0264* (2006.01)
*G01J 1/04* (2006.01)
*G01J 3/02* (2006.01)
*G01J 3/28* (2006.01)
*G01J 9/00* (2006.01)

(56) References Cited

OTHER PUBLICATIONS

Singh, Upendra N. et al., "Novel Techniques and Technologies for Active Optical Remote Sensing of Greenhouse Gases," Conference paper, 2017, 6 pages.
Petros, Mulugeta et al., "Development of Double-Pulsed Two-Micron Laser for Atmospheric Carbon Dioxide Measurements," Conference paper, 2017, 2 pages.
Singh, Upendra N. et al., "Airborne Lidar for Simultaneous Measurement of Column CO2 and Water Vapor in the Atmosphere," Conference paper, 2016, 11 pages.
Singh, Upendra N. et al., "Development of an Airborne Triple-Pulse 2-um Integrated Path Differential Absorption Lidar (IPDA) for Simultaneous Airborne Column Measurements of Carbon Dioxide and Water Vapor in the Atmosphere," 18th Coherent Laser Radar Conference, Jun. 26-Jul. 1, 2016, pp. 1-4.
Refaat, Tamer F. et al., "Wavelength Locking to CO2 Absorption Line-center for 2-um Pulsed IPDA Lidar Application," Conference paper, 2016, 8 pages.
Singh, Upendra N. et al., "2-Micron Triple=pulsed Integrated Path Differential Absorption Lidar Development for Simultaneous Airborne Column Measurements of Carbon Dioxide and Water Vapor in the Atmosphere," Conference paper, 2016, 10 pages.
Yu, Jirong, et al., Testing of a 2-um CO2 Double-Pulse IPDA Lidar Instrument for Airborne Atmospheric Carbon Dioxide Measurement, NASA Langley Research Center Presentation Slides, AGU Fall Meeting, Dec. 15, 2015, 17 pages, Sanfrancisco, CA.
Sing, U. et al., "Mars Atmospheric Characterization Using Advanced 2-um Orbiting Lidar," Conference paper, 2015, 2 pages.
Singh, Upendra N. et al., "Double-pulsed 2-um Lidar Validation for Atmospheric CO2 Measurements," NASA Langley Research Center Presentation Slides, SPIE Remote Sensing—New Developments in Lidar Technology I, Sep. 21, 2015, 17 pages, Toulouse, France.
Refaat, Tamer, F. et al., "Evaluation of an airborne triple-pulsed 2-µm IPDA lidar for simultaneous and independent atmospheric, water vapor and carbon dioxide measurements," Appl. Opt., 2015, pp. 1387-1398, vol. 54.
Hamamatsu Corporation, "InGaAs PIN Photodiode, G8422/G8372/G5852 series, Long Wavelength type (up to 2.1 um)," datasheet, Sep. 2001.
Hamamatsu Corporation, "InGaAs PIN Photediode, G8423/G8373/G5853 series, Long Wavelength type (up to 2.6 um)," datasheet, Apr. 2001.
Stanford Research Systems, "Model SRS70 Low-noise Current Preamplifier," datasheet, 1997 (Aug. 2015 Revision 1.7).
FEMTO Messtechnik GmbH, "DHPCA-100 Variable Gain High Speed Current Amplifier" datasheet, Nov. 2010.

\* cited by examiner

FAST AND PRECISE WAVELENGTH AND POWER MEASUREMENTS TECHNIQUE FOR CONTINUOUS WAVE, MODULATED, AND PULSED MONOCHROMATIC RADIATION

STATEMENT REGARDING FEDERALLY SPONSORED RESEARCH OR DEVELOPMENT

The invention described herein was made by employees of the United States Government and may be manufactured and used by or for the Government of the United States of America for governmental purposes without the payment of any royalties thereon or therefore.

OVERVIEW

In many measurement applications, such as remote measurements of atmospheric trace gases, monochromatic radiation with multiple discrete wavelengths is required to enable the measurements. Monochromatic radiation with multiple discrete wavelengths falls within a narrow spectral range and is often produced in successive pulses separated by a short time. There are currently no instruments or techniques that measure and monitor multiple discrete wavelengths of high repetition-rate pulses in real-time. Some wavelength measurement instruments and techniques currently exist, such as for example, wavelength measurement instruments and techniques based on dispersive optics (e.g., gratings, etalon, or Fabry-Pérot interferometers). However, these current measurement instruments and techniques suffer limited resolutions, require the use of complicated algorithms, and require long integration time, especially toward long wavelength radiation such as infrared and far-infrared. Therefore, these current instruments are best suited for continuous broad-band radiation sources with better performance toward shortwave radiations and do not measure and monitor multiple discrete wavelengths of high repetition-rate pulses in real-time. Another example of wavelength measurement instruments and techniques that currently exist but do not measure and monitor multiple discrete wavelengths of high repetition-rate pulses in real-time are the current frequency transform instruments and techniques, such as heterodyne detection, which require reference radiation. Heterodyne detection offers limited sensitivity, requires high bandwidth spectrum analysis depending on the wavelength separation between the actual measured and reference radiations, and does not result in the actual wavelength of the radiation being measured. Rather, heterodyne detection measures an offset from the reference radiation limiting the sensitivity. Thus, heterodyne detection does not measure and monitor multiple discrete wavelengths of high repetition-rate pulses in real-time.

BRIEF SUMMARY

Systems, methods, and devices of the various embodiments provide fast and precise methods for continuously monitoring and measuring the absolute wavelength of monochromatic radiation sources, such as lasers, etc., irrespective of the temporal profile of the source (i.e., continuous wave, modulated, or pulsed). Radiation power measurement may also be enabled by one or more embodiment methods. One or more embodiments may utilize high-speed low-noise detection to enable fast and accurate measurements. High-precision wavelength and power measurement may be achieved in various embodiments to monitor radiation source jitters and fluctuations, without relying on frequency transforms or dispersive optics. Both wavelength and power may be measured simultaneously or sequentially in some various embodiments. One or more embodiments may enable quantum detectors to operate as radiation wavelength transducers in addition to radiation power transducers to obtain both power and wavelength of the incident monochromatic radiation, such as lasers, simultaneously.

In one embodiment, a system for measuring a monochromatic radiation source is provided. The system includes a detector configured to receive at least a portion of radiation output from a radiation source and output voltages in response to the received radiation. The system also includes a temperature controller configured to adjust the temperature of the detector to a first temperature and to a second different temperature. The system further includes an acquisition instrument configured to receive a first voltage from the detector output while the temperature of the detector is the first temperature and a second voltage from the detector output while the temperature of the detector is the second temperature. The acquisition instrument is also configured to determine the wavelength and the power of the radiation source based at least in part on the first voltage and the second voltage records.

In another embodiment, a system for measuring a monochromatic radiation source includes a splitter configured to receive at least a portion of radiation output from the radiation source and split that radiation into a first portion of radiation and a second portion of radiation. The system first and second detectors, each configured to receive the respective portion of radiation from the splitter and output a respective voltage in response. The system includes a first temperature controller configured to set the temperature of the first detector and a second temperature controller configured to set the temperature of the second detector to a temperature that may be different from that of the first detector. The system further includes an acquisition instrument configured determine a wavelength and a power of the radiation output from the radiation source based on the voltages output by the first and second detectors.

A method is also provided for measuring a radiation source wavelength and power. A first voltage and a second voltage are output by one or more detectors in response to receiving radiation from a radiation source. A wavelength and a power of the radiation from the radiation source are determined based at least in part on the first voltage and the second voltage obtained, for example, as described above.

These and other features, advantages, and objects of the present invention will be further understood and appreciated by those skilled in the art by reference to the following specification, claims, and appended drawings.

BRIEF DESCRIPTION OF THE SEVERAL VIEWS OF THE DRAWINGS

The accompanying drawings, which are incorporated herein and constitute part of this specification, illustrate exemplary embodiments of the invention, and together with the general description given above and the detailed description given below, serve to explain the features of the invention.

DETAILED DESCRIPTION

Figure 1:
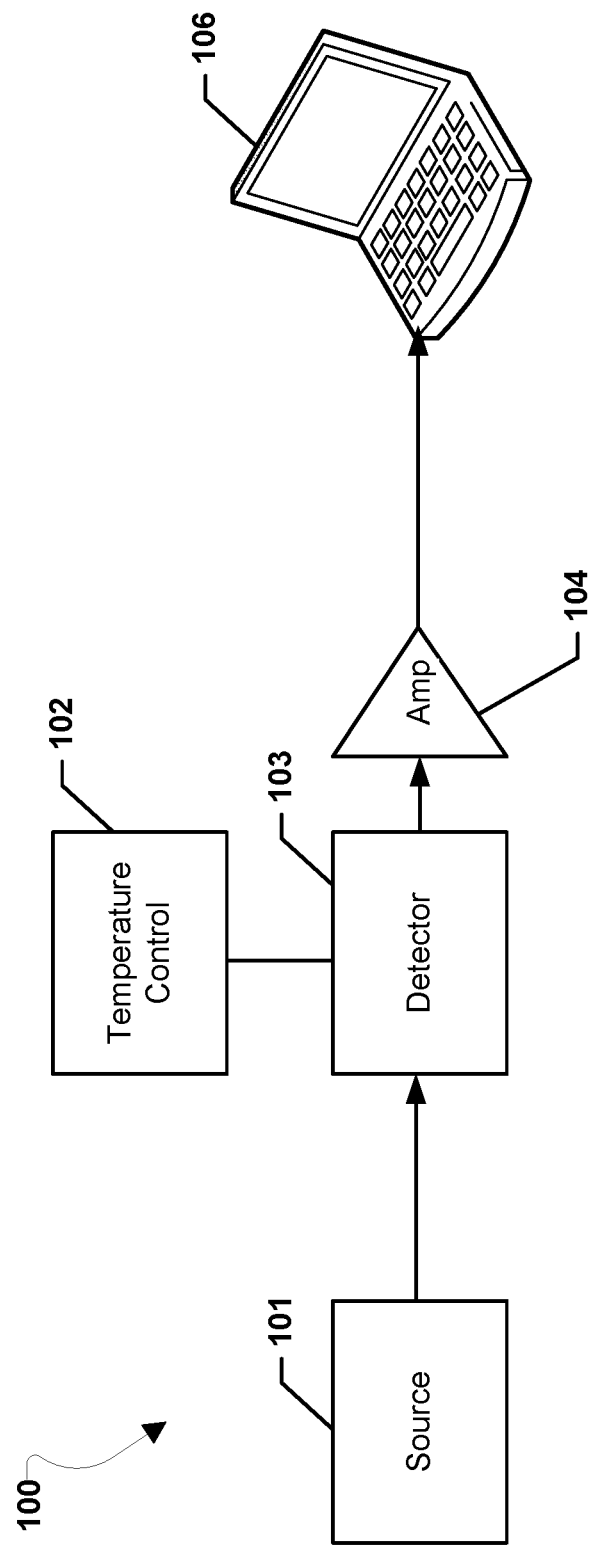
FIG. 1 illustrates a single detector system for measuring wavelength ($\lambda$) and power (P) sequentially using two different temperature settings, consistent with one or more embodiments of the present disclosure.

It is to be understood that various embodiments may assume various alternative orientations and step sequences, except where expressly specified to the contrary. It is also to be understood that the specific devices and processes illustrated in the attached drawings, and described in the following specification, are simply exemplary embodiments of the concepts described in the appended claims. Hence, specific dimensions and other physical characteristics relating to the embodiments disclosed herein are not to be considered as limiting, unless the claims expressly state otherwise.

As used herein, the term "computing device" refers to a device having one or more digital or analog computing and/or recording circuits (e.g., a general purpose processor, a digital signal processor (DSP), an application specific integrated circuit (ASIC), a field programmable gate array (FPGA) or other programmable logic device, discrete gate or transistor logic, discrete hardware components, or any combination thereof) configured, designed and arranged to perform one or more set of operations, as described herein. Computing devices may include, but are not limited to, oscilloscopes, waveform recorders and digitizers, cellular telephones, smart phones, personal or mobile multi-media players, personal data assistants (PDAs), laptop computers, personal computers, tablet computers, smart books, palm-top computers, wireless electronic mail receivers, multimedia Internet enabled cellular telephones, wireless gaming controllers, satellite or cable set top boxes, streaming media players, smart televisions, digital video recorders (DVRs), and similar electronic devices which include circuitry for performing the operations described herein.

One or more embodiments provide a simple and accurate technique for measuring monochromatic radiation wavelength based on a detector spectral response. The systems, methods, and devices of some various embodiments may provide fast and precise methods for continuously monitoring and measuring the absolute wavelength of monochromatic radiation sources, such as lasers, etc., irrespective of the temporal profile of the source (i.e., continuous wave, modulated, or pulsed). Radiation power measurement may also be enabled by one or more embodiment methods. One or more embodiment methods may utilize high-speed low-noise detection to enable fast and accurate measurements. High-precision wavelength and power measurement may be achieved in one or more embodiments to monitor radiation source jitters and fluctuations, without relying on frequency transforms or dispersive optics. Both wavelength and power may be measured simultaneously or sequentially in various implementations.

Generally, quantum detectors are power transducers that convert radiation power, P (in Watts (W)), into electric current, I (in Amps (A)) through the photoelectric effect and Beer-Lambert law. After correcting for dark current and away from saturation, a detector output current is linearly proportional to the incident radiation power through a factor defined as responsivity, $\mathcal{R}$ (in A/W), according to Equation (1):

$$I = \mathcal{R} * P \tag{1}$$

The responsivity of a quantum detector is dependent on the material properties, the device structure, the device bias voltage, $V_b$ (in Volt (V)), operating temperature, T (in °C.) and the wavelength, λ (in nanometers (nm)) of the incident radiation. Different detectors are commercially available using different materials with different structures that are suited for application within defined spectral range. For example, single-element detectors such as silicon (Si) detectors are suitable for detecting radiation in the spectral range from 300 nm to 1100 nm, and germanium (Ge) detectors are suitable for detecting radiation in the spectral range from 800 nm to 1800 nm. For a given material (or materials) and structure, while operating the detector at fixed bias and temperature, the responsivity of the device becomes dependent only on the incident radiation wavelength in the form of Equation (2):

$$\mathcal{R} = \text{function}(\lambda). \tag{2}$$

The relation between $\mathcal{R}$ and λ is defined as the spectral response. Inherent to the material properties of the detector, typically the spectral response starts with the cut-on wavelength, and gradually increases with wavelength until a peak response occurs, which is followed by a sharp decrease in responsivity that defines the cut-off wavelength. Spectral response is obtained empirically through calibration without a standard analytical function that describes the detailed behavior of each device. Nevertheless, for narrow spectral regions (within nanometers or less), Equation (2) could be represented analytically, for example, through polynomial curve fitting of the calibration data. Further, for finite spectral regions (within few nanometers) a higher order polynomial could be avoided and a linear fitting will suffice, in the form of Equation (3):

$$\mathcal{R} = \mathcal{R}_0 + \mathcal{R}_\lambda * \lambda \tag{3}$$

where $\mathcal{R}_0$ (in A/W) is a constant responsivity term, and $\mathcal{R}_\lambda$ (in A/W*nm) is the wavelength dependent term. Therefore, for a finite spectral region, the detector output current is expressed by substituting Equation (3) into Equation (1) resulting in Equation (4):

$$I = (\mathcal{R}_0 + \mathcal{R}_\lambda * \lambda) * P \tag{4}$$

which indicates that the detector output current is proportional to both power and wavelength. The detected electric current is converted to voltage signal, V (in Volt (V)), using a trans-impedance amplifier (TIA) with a gain, G (in V/A) according to Equation (5):

$$V = I * G = (\mathcal{R}_0 + \mathcal{R}_\lambda * \lambda) * G * P \tag{5}$$

The resolution of the voltage measurement, dV, (in V) depends on the noise associated with the detection process. The detection process total noise voltage spectral density ($V_n$ in V/(Hertz (Hz))$^{1/2}$) is given by Equation (6):

$$V_n = G * \sqrt{I_{nd}^2 + 2*q*(\mathcal{R}_0 + \mathcal{R}_\lambda * \lambda)*P + i_0^2 + \frac{v_0^2}{G^2} + \frac{4*k*T_A}{G}} \tag{6}$$

where $I_{nd}$ is the detector dark current noise, q is the electron charge, $i_0$ and $v_0$ are the TIA current and voltage noises spectral densities, respectively, $T_A$ is the TIA temperature (assumed 300 K), and k is the Boltzmann constant. The measured voltage resolution is dependent on the detection bandwidth, BW (in Hz) and is given by Equation (7):

$$dV = V_n * \sqrt{BW}. \quad (7)$$

One or more embodiments may enable quantum detectors to operate as radiation wavelength transducers in addition to radiation power transducers to obtain both power and wavelength of the incident monochromatic radiation, such as lasers, simultaneously For a given input radiation with power, P(W), and wavelength, λ, (nm), one or more embodiments may enable fast and accurate measurement for λ to be obtained. To achieve that, one or more embodiments may leverage the properties of the spectral response characteristics of radiation detectors. The spectral response is defined as the detector responsivity, $\Re$ (in A/W) variation with wavelength. A detector's spectral response depends on the device material, structure, operating bias voltage and temperature. For example, the cut-off region of quantum detectors exhibit strong wavelength dependence for the responsivity that is inherent to, and defined by, the properties of the device material, structure and operating conditions. Obtaining two independent measurements, using two different wavelength-dependent conditions, enables solving for both radiation power and wavelength. Different wavelength-dependent conditions may be created in one or more embodiments by operating a single detector at different bias voltages and/or temperatures or by using two different detectors. For example, for the 2-micrometer (μm) radiation, extended range indium gallium arsenide (InGaAs) pin detectors exhibit a cutoff wavelength around 2.1-μm at room temperature. For the same device, this cutoff wavelength is shifted to about 2.05-μm by cooling down the device to −20° C. Another example for the same wavelength region is to use two different extended range InGaAs pin detectors with different cut-off wavelengths, such as a first detector with a cut-off wavelength of 2.1-μm and a second detector with a cut-off wavelength of 2.6-μm.

In one or more embodiments, for an input radiation to a detector, P and λ may be obtained by applying Equation (5) twice for two independent measurements, $V_1$ and $V_2$, at two different calibrated conditions, in terms of different biases, temperatures, and/or detectors. $V_1$ and $V_2$ may be found according to Equations (8A and 8B) as follows:

$$V_1 = (\Re_{0,1} + \Re_{\lambda,1} * \lambda) * G_1 * P; \text{ and} \quad (8A)$$

$$V_2 = (\Re_{0,2} + \Re_{\lambda,2} * \lambda) * G_2 * P. \quad (8B)$$

Solving Equation (8) for P and λ results in Equations (9) and (10) as follows:

$$P = [\Re_{\lambda,2} * G_2 * V_1 - \Re_{\lambda,1} * G_1 * V_2]/[G_1 * G_2 * (\Re_{0,1} * \Re_{\lambda,2} - \Re_{0,2} * \Re_{\lambda,1})]; \text{ and} \quad (9)$$

$$\lambda = -[\Re_{0,2} * G_2 * V_1 - \Re_{0,1} * G_1 * V_2]/[\Re_{\lambda,2} * G_2 * V_1 - \Re_{\lambda,1} * G_1 * V_2]. \quad (10)$$

The resolution of the obtained power, dP (in W) is given by Equation (11) as follows:

$$dP = \frac{\delta P}{\delta V_1} * dV_1 + \frac{\delta P}{\delta V_2} * dV_2 \quad (11)$$

Equation (11) may be applied to Equation (9) resulting in Equation (12) as follows:

$$dP = \left[ \left( \Re_{\lambda,2} * \frac{dV_1}{G_1} \right) \pm \left( \Re_{\lambda,1} * \frac{dV_2}{G_2} \right) \right] / [\Re_{0,1} * \Re_{\lambda,2} - \Re_{0,2} * \Re_{\lambda,1}]. \quad (12)$$

Similarly, the resolution of the obtained wavelength, dλ (in nm) is given by Equation (13) as follows:

$$d\lambda = \frac{\delta \lambda}{\delta V_1} * dV_1 + \frac{\delta \lambda}{\delta V_2} * dV_2. \quad (13)$$

Equation (13) may be applied to Equation (10) and results in Equation (14) as follows:

$$d\lambda = G_1 * G_2 * [\Re_{0,1} * \Re_{\lambda,2} - \Re_{0,2} * \Re_{\lambda,1}] * \frac{V_1 * dV_2 \pm V_2 * dV_1}{[\Re_{\lambda,2} * G_2 * V_1 - \Re_{\lambda,1} * G_1 * V_2]^2}. \quad (14)$$

Equations (12) and (14) imply that the resolutions in P and λ calculations depend on the measured voltages, the resolution of the measured voltages and the accuracy of the calibrations. This demonstration (for wavelength and power and their resolutions, i.e., equations 8 through 14) is applied for linear spectral response fitting as described by equation (3). Higher order and/or other fitting could be applied analytically or empirically would result in similar conclusions.

In one or more embodiments, sequential measurements may be taken with one detector. In such embodiments, λ and P may be obtained by using a single detector with a cutoff wavelength close to the unknown wavelength λ, such as an extended InGaAs pin detector with a 2.1-μm cutoff wavelength for 2.05 μm laser. Two measurements may be obtained with the detector output currents or voltages at two different conditions, such as two different temperatures, resulting in two equations to be solved for the λ and P. Since the two measurements are obtained sequentially, the radiation source should be stable with constant radiation power and wavelength. In addition, high responsivity discrimination should be obtained due to the different temperatures at the measured wavelength.

Figure 2:
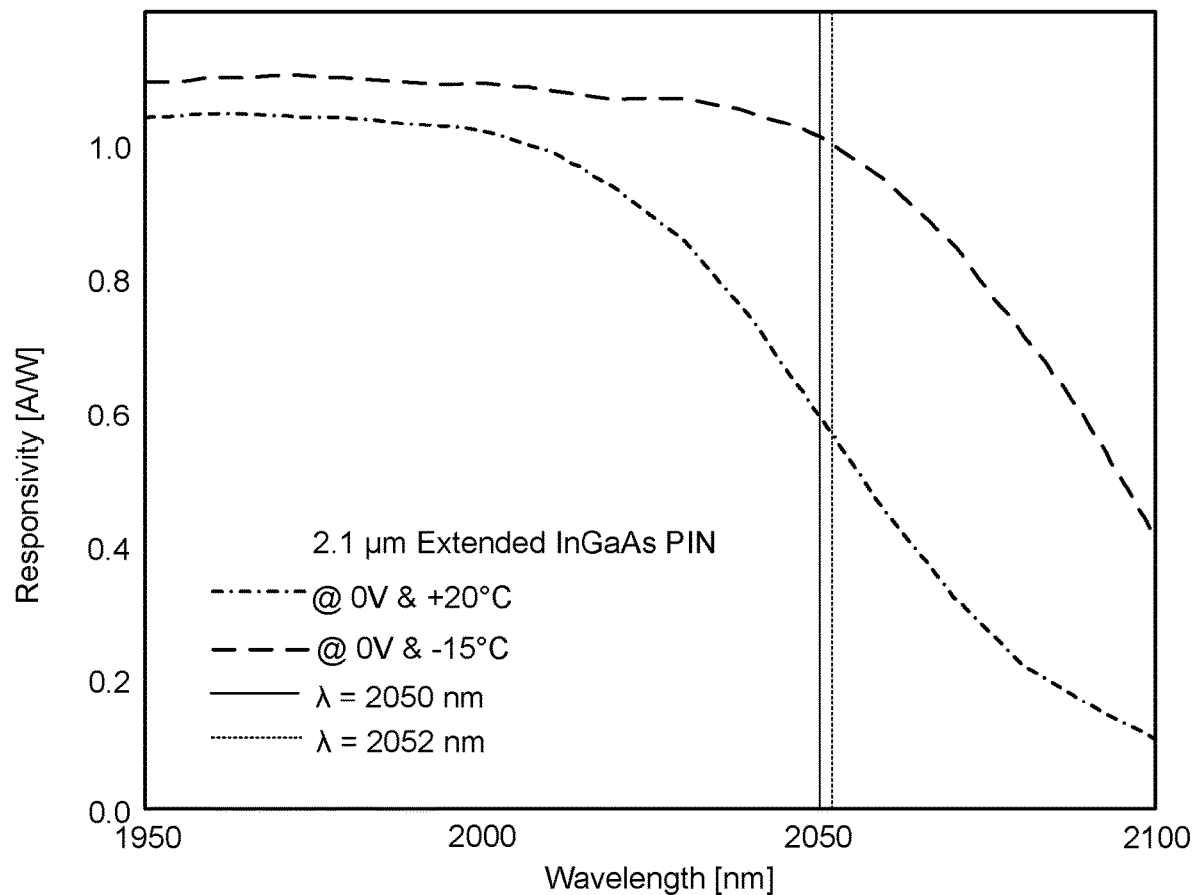
FIG. 2 illustrates an example spectral response of a detector at two different temperatures, consistent with one or more embodiments of the present disclosure.

FIG. 1 illustrates an example of a single detector system 100 for measuring wavelength (λ) and power (P) sequentially, in accordance with one or more embodiments. The system 100 may include a source 101, a detector 103, an amplifier 104, a temperature controller 102, and an acquisition instrument 106, such as a computing device. The source 101 may be, for example, a monochromatic radiation source, such as a laser, etc., and may output continuous wave radiation, modulated wave radiation, and/or pulsed radiation. The radiation output from the source 101 to be measured, such as a monochromatic 2 μm single mode laser source, may be received by the detector 103. For example, the detector 103 may be a near infrared detector. As an illustrative example, the detector 103 may be an extended range InGaAs pin detector with cut-off at 2.1-μm. The cut-off region of the spectral response for such a detector 103 is illustrated in FIG. 2. In some implementations, the temperature controller 102 may include a device such as thermoelectric cooler, cryogenic cooler, chiller, or other type of temperature controlling device, configured to control the temperature of detector 103. The temperature controller 102 may change the temperature of the detector 103 within a temperature range. For example, the temperature controller 102 may change the temperature from 20° C. to −20° C. In this manner, the voltage output of the detector 103 at different temperatures is measured. Referring to FIG. 1, amplifier 104 may be used for any signal conditioning of the detector output, such as a trans-impedance amplifier for current to voltage conversion. Detector 103 output signals are based on the radiation from the source 101 incident on its active surface. These signals may be provided to the amplifier 104, which may amplify the signals and output the amplified signals to the acquisition instrument 106, such as a computing device. A first voltage signal from the detector 103 and amplifier 104 may be received at the acquisition instrument 106 generated while the detector 103 is at a first temperature (e.g., 20° C.). The temperature of the detector 103 may then be adjusted to a second temperature (e.g., −15° C.) by the temperature controller 102 and a second voltage signal from the detector and amplifier 104 may be received at the acquisition instrument 106 generated while the detector 103 is at the second temperature (e.g., −15° C.). The temperature controller 102 may also provide indications of the temperatures (e.g., the first temperature and second temperature) to the acquisition instrument 106. Based on the voltages received (i.e., the first voltage, V1, and the second voltage, V2), the acquisition instrument 106, such as a computing device, may perform operations to determine the wavelength ($\lambda$) and power (P) sequentially according to one or more of Equations (1)-(14) based on the voltages received (i.e., the first voltage and the second voltage) and temperatures (e.g., the first temperature and second temperature) of the detector when those voltages where generated. Focusing on the responsivity variation between 2050 nm and 2052 nm, the responsivity parameters of Equation (3) are listed in Table 1 for two different operating temperatures used in an example simulated experiment performed using the system 100 with an InGaAs (2.1 µm) detector 103.

TABLE 1

|  | $V_b(V)$ | T (° C.) | $\Re_0$ (A/W) | $\Re_\lambda$ (A/W · nm) |
|---|---|---|---|---|
| First Temp. | 0.0 | 20 | 12.289 | −0.0055 |
| Second Temp. | 0.0 | −15 | 31.342 | −0.015 |

Table 2 lists the measurement results for two examples for an assumed radiation wavelength of 2051 nm in the simulated experiment performed using the system 100 at the temperatures in Table 1. Radiation power was limited to avoid saturation.

TABLE 2

| Input | TIA Calibration | | | Measurements | | | | | |
|---|---|---|---|---|---|---|---|---|---|
| P (W) | $G_1$ (V/A) | $G_2$ (V/A) | BW (MHz) | $V_1$ (V) | $dV_1$ (mV) | $V_2$ (V) | $dV_2$ (mV) | dP (W) | $d\lambda$ (pm) |
| First Example | $2 \times 10^{-3}$ | $10^3$ | $10^3$ | 80.00 | 2.0 | 0.3 | 1.2 | 0.2 | $4.5 \times 10^{-7}$ | 16 |
| Second Example | $2 \times 10^{-7}$ | $10^7$ | $10^7$ | 0.22 | 2.0 | 1.5 | 1.2 | 1.0 | $2.3 \times 10^{-10}$ | 77 |

With known power and wavelength, Equations (7) and (8) were applied to obtain the measured voltages and their resolutions. For the calibration parameters, presented in Tables 1 and 2, measured power resolution is proportional to the applied power, while wavelength resolution is inversely proportional to the applied power. Tradeoff between the TIA bandwidth and measurement resolution is observed due to the total noise contribution to the measured voltages. In this method, a stable radiation source 101 is assumed, since V1 and V2 are measured sequentially (at two different times).

In one or more embodiments, simultaneous measurements may be taken with two detectors. For example, the first detector may have a cutoff wavelength that includes $\lambda()$ and the second detector may have a different wavelength response, preferably independent on $\lambda()$. Since two detectors are used, the two required measurements may be obtained simultaneously by splitting the input radiation between the two detectors. As the second detector's responsivity may be independent of $\lambda$, the output current result in power measurement directly. Then, the first detector's output current may directly correlate to $\lambda$ after power correction.

Figure 3:
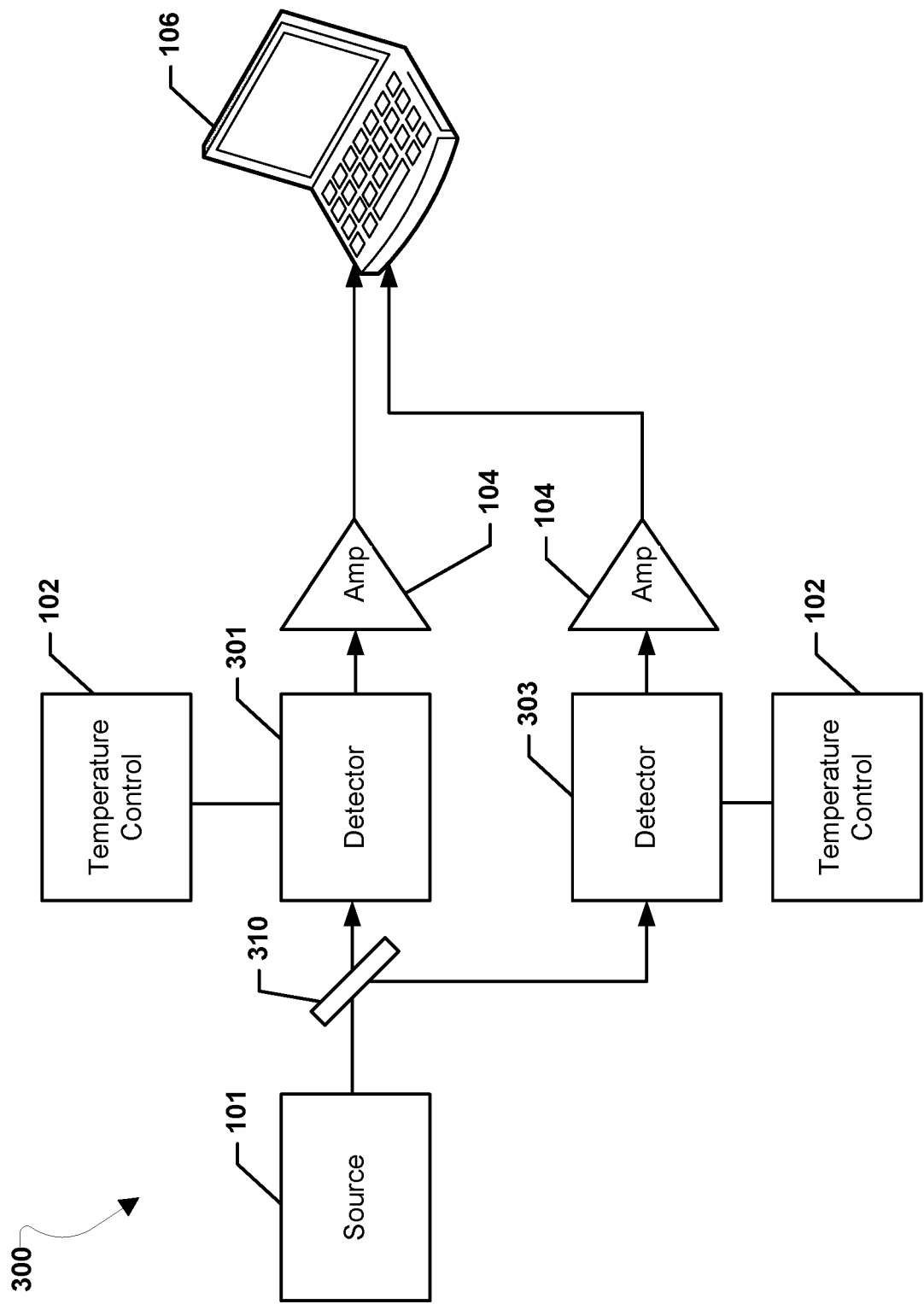
FIG. 3 illustrates a two detector system for measuring wavelength (λ) and power (P) simultaneously, consistent with one or more embodiments of the present disclosure.
Figure 4:
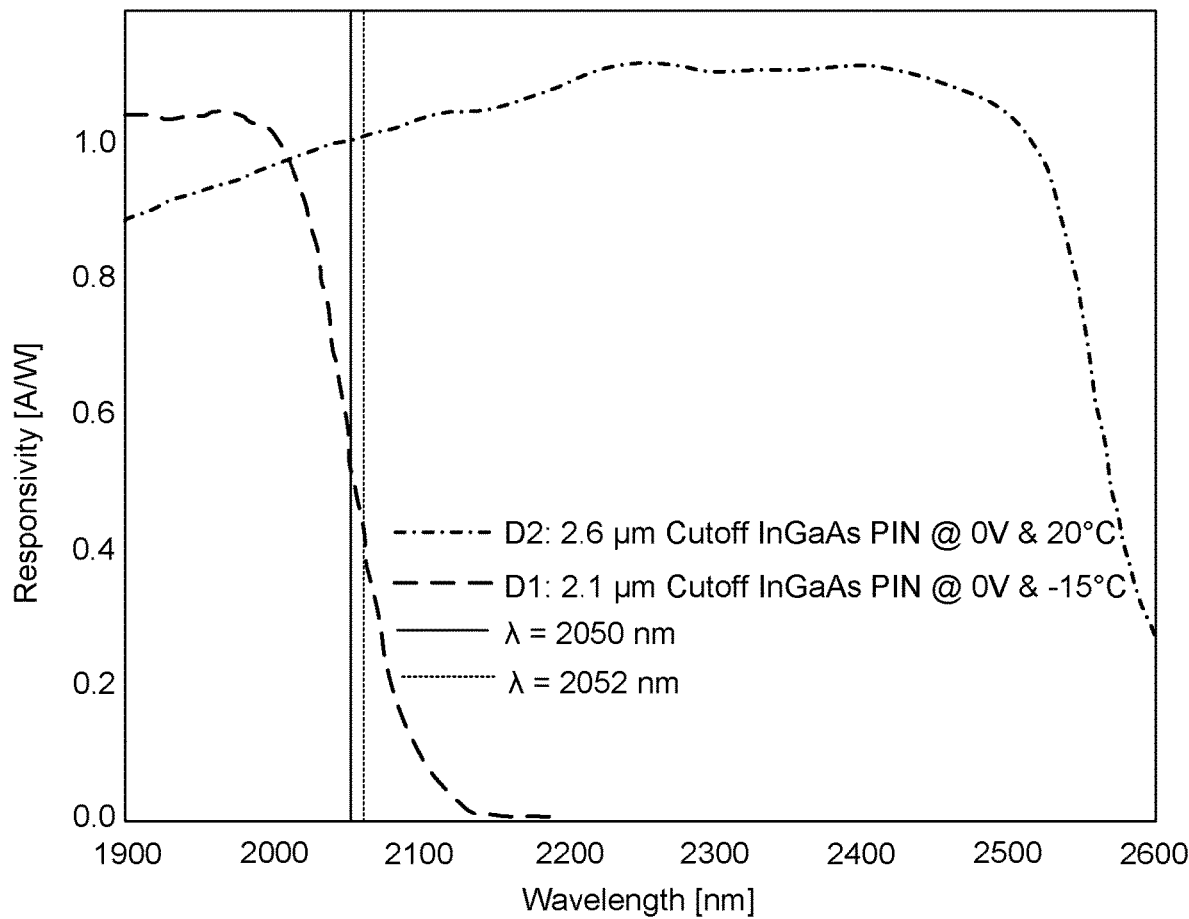
FIG. 4 illustrates an example spectral response of two detectors at two different temperatures, consistent with one or more embodiments of the present disclosure.

FIG. 3 illustrates a two detector system 300 according to an embodiment for measuring wavelength ($\lambda$) and power (P) simultaneously. The setup of system 300 is similar to system 100 described above, except that instead of a single detector 103, two separate detectors 301 and 303 each with their own respective temperature controller 102 and amplifier 104 may be used. The radiation from the source 101 may be split into two portions by a splitter 310, such as a perfect 50/50 beam splitter. In some embodiments, the source 101 power in system 300 may be 2P, thereby providing radiation with power P to each detector 301 and 303. The voltage output of the detectors 301 and 303 may be measured by the acquisition instrument 106, such as a computing device, simultaneously. In this manner, continuous monitoring for both power and wavelength may be achieved, which may be suitable for monitoring the source power fluctuations and wavelength jitter. The detectors 301 and 303 may output their signals to respective amplifiers 104 that output voltages to the acquisition instrument 106. The amplifiers 104 may be, for instance, variable gain TIAs. In some embodiments, the amplifiers 104 may be the same type amplifiers. In some embodiments, the amplifiers 104 may be different type amplifiers. In some embodiments, the amplifiers 104 may be selected based on the application, such as a first amplifier being a high-bandwidth amplifier for high-speed applications, such as pulsed sources, and a second amplifier being a low-bandwidth low-noise amplifier for continuous wave sources. As an illustrative example for 2-µm wavelength applications, the first detector 301 may be an extended range InGaAs pin with 2.6-µm cut-off wavelength and the second detector 303 may be an extended range InGaAs pin with cut-off at 2.1-µm. Spectral responses for both such detectors 301 and 303 are shown in FIG. 4.

Referring again to FIG. 3, the detectors 301 and 303 output signals based on the radiation from the splitter 310 incident on the detectors 301 and 303. These signals may be provided to the respective amplifiers 104, which may amplify the signals and output the amplified voltages to the acquisition instrument 106, such as a computing device. A first voltage from the detector 301 and amplifier 104 may be received at the acquisition instrument 106 generated while the detector 301 is at a first temperature (e.g., 20° C.). A second voltage from the detector 303 and amplifier 104 may be received at the acquisition instrument 106 generated while the detector 303 is at a second temperature (e.g., −15° C.). The temperature controllers 102 may also provide indications of the temperatures (e.g., the first temperature and second temperature) to the acquisition instrument 106. Based on the voltages received (i.e., the first voltage and the second voltage), the acquisition instrument 106, such as a computing device, may perform operations to determine the wavelength ($\lambda$) and power (P) simultaneously. For example, the acquisition instrument 106, such as a computing device, may perform operations to determine the wavelength ($\lambda$) and power (P) simultaneously according to one or more of Equations (1)-(14) based on the on the voltages received (i.e., the first voltage and the second voltage) and temperatures (e.g., the first temperature and second temperature) of the detector when those voltages where generated. Focusing on the responsivity variation between 2050 nm and 2052 nm, the responsivity parameters of Equation (3) are listed in Table 3 for both detectors 301 and 303 used in an example simulated experiment performed using the system 300.

TABLE 3

| Detector | $V_b(V)$ | T (° C.) | $\Re_o$ (A/W) | $\Re_\lambda$ (A/W · nm) |
|---|---|---|---|---|
| InGaAs (2.6 μm) | 0.0 | −20 | −1.041 | 0.001 |
| InGaAs (2.1 μm) | 0.0 | −15 | 31.342 | −0.015 |

Table 4 lists the measurement results for three examples for an assumed radiation wavelength of 2051 nm in the simulated experiment performed using the system 300 with the two detectors described in Table 3. Radiation power was limited to avoid saturation.

TABLE 4

| Input | | TIA Calibration | | | Measurements | | | | | |
|---|---|---|---|---|---|---|---|---|---|---|
| | P (W) | $G_1$ (V/A) | $G_2$ (V/A) | BW (MHz) | $V_1$ (V) | $dV_1$ (mV) | $V_2$ (V) | $dV_2$ (mV) | dP (W) | $d\lambda$ (pm) |
| First Example | $2 \times 10^{-3}$ | $10^3$ | $10^3$ | 80.00 | 2.0 | 0.3 | 1.2 | 0.2 | $2.7 \times 10^{-7}$ | 12 |
| Second Example | $2 \times 10^{-7}$ | $10^7$ | $10^7$ | 0.22 | 2.0 | 1.7 | 1.2 | 1.0 | $1.7 \times 10^{-10}$ | 63 |
| Third Example | $1 \times 10^{-6}$ | $10^7$ | $10^7$ | 0.002 | 10.1 | 0.3 | 5.8 | 0.2 | $2.8 \times 10^{-11}$ | 2.3 |

With the known power and wavelength, Equations (7) and (8) were applied to obtain the measurement voltages and their resolutions. For the calibration parameters presented in Tables 3 and 4, measured power and wavelength resolutions depend on the TIA performance.

Embodiment double-detector methods may provide enhanced sensitivity compared to embodiment single-detector methods. This is expected due to larger difference in the spectral response that enhances the output voltage discrimination for the same wavelength and power, which in turn enhances the sensitivity. Although the examples discussed above are primarily described with reference to quantum detectors, thermal detectors may be substituted for both or single quantum detectors in the double-detector embodiment. Thermal detectors inherently exhibit an extended flat spectral response, almost independent of wavelength. Therefore, wavelength dependence may be implemented artificially by using optical filters, such as temperature tunable band-pass optical filters. Such optical filters may also be implemented with quantum detectors. This may be useful to monitor wavelength and power for any other laser source with other suitable detectors, such as 1064 nm laser sources with Si detectors.

Figure 5:
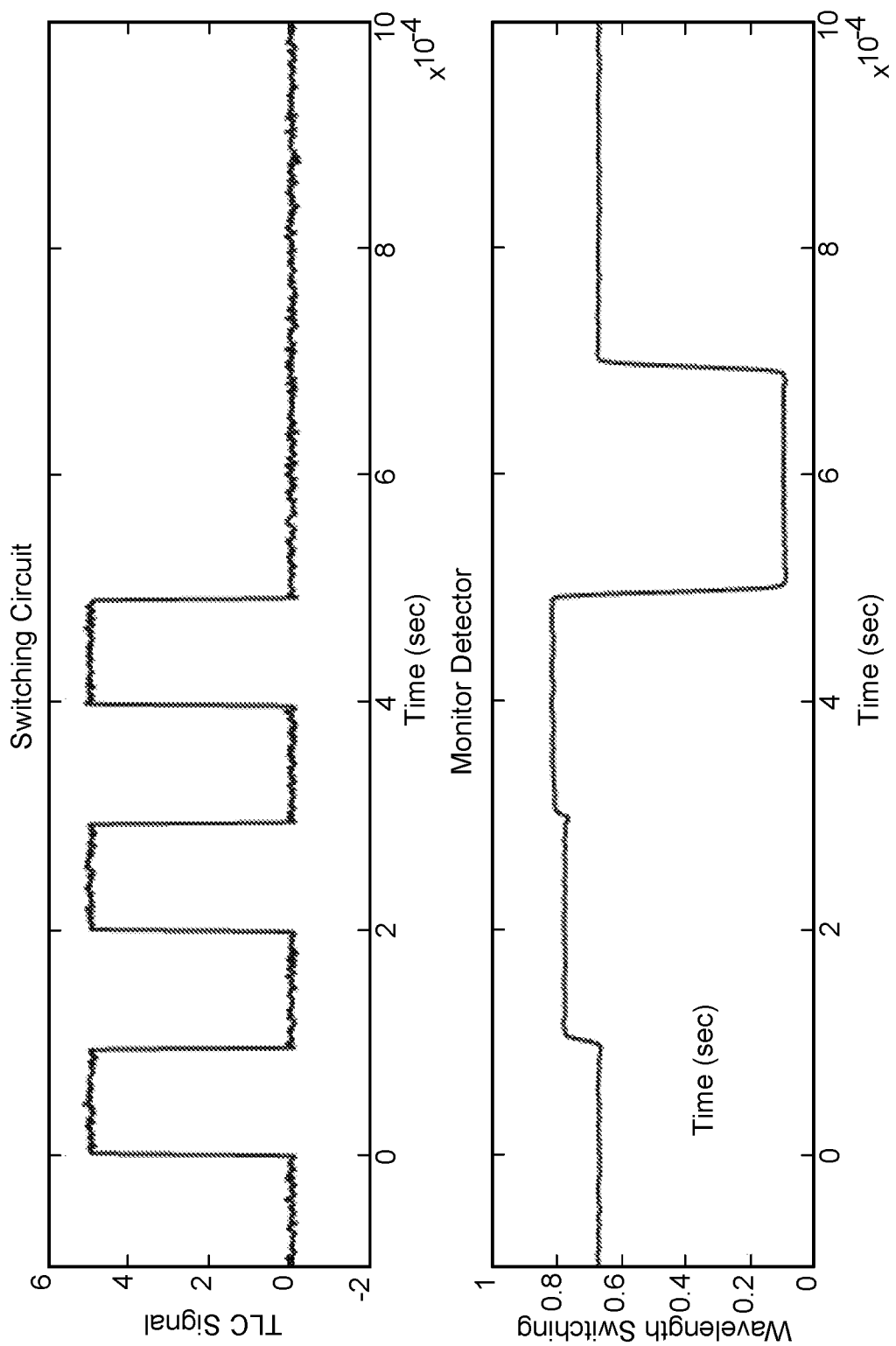
FIG. 5 illustrates example results of measurements using a single detector, consistent with one or more embodiments of the present disclosure.

FIG. 5 illustrates example results of measurements using a single detector according to one or more embodiments of the present disclosure. FIG. 5 shows the variation of the detector output voltage with the wavelength of a 2-μm laser source. The wavelength was alternatively switched between 2050.5094, 2051.0590 and 2051.1915 nm. Switching control was obtained from an electronic switch and pulse generator on the falling edge of the (Timing Logic Circuit) TLC signal. Only a single extended range InGaAs pin detector with cut-off at 2.1-μm was used in the experiment for which the results are shown in FIG. 5 and the experiment demonstrated the validity of the single detector embodiments.

In one or more embodiments, other methods may be applied to achieve the same P and $\lambda$ measurements including artificially generating the cutoff wavelength by incorporating optical filters, which may be tunable for wavelength selection. In such methods, thermal detectors may be used. Although thermal detectors are characterized by flat response (i.e., constant spectral response) and are almost independent on wavelength throughout far infrared, thermal detectors may exhibit sluggish response due to longer thermal time-constants and may not be suitable for high repetition rate pulsed applications.

One or more embodiments may enable continuous measurement and monitoring of radiation wavelength and power simultaneously. One or more embodiments may include some initial calibration for the detectors being used, specifically around the expected detection wavelength. Depending on the noise level of the setup, one or more embodiments may result in high-resolution wavelength measurement (2.3 picometers (μm) or less) that may be suitable for wavelength jitter measurements for monochromatic sources, such as lasers. Using high-speed quantum detectors, associated with high-bandwidth electronics, one or more embodiments may be suitable for continues wave, modulated and pulsed radiation. In one or more embodiments, for pulsed monochromatic radiation, high frequency pulses may be monitored individually with logging of wavelength and power per-pulse to monitor fluctuations, jitters, and drifts.

One or more embodiments may be used with any wavelength dependent on a detector's material inherent properties, structure, operating conditions and/or optical filters to artificially generate wavelength dependent responses, such as cut-off regions, in compliance with the targeted wavelength. For most detector and filter materials, the cut-off may be tuned by changing the operating temperature. For example, Si-based and Ge-based detectors' spectral responses exhibit temperature and bias voltage sensitivities from 400 to 1100 nm and 1500 to 1800 nm, respectively, which are suitable for 532, 820, 940, 1064, and 1570 nm monochromatic sources according to one of more embodiments.

Fast and precise wavelength monitoring according to one or more embodiments may be relatively simple and may have many potential commercial applications in the fields of radiation detection, including active remote sensing and telecommunication industries. For example, some various embodiments may be used to provide wave-meters with the speed and accuracy required for fast-pulsed applications.

Figure 6:
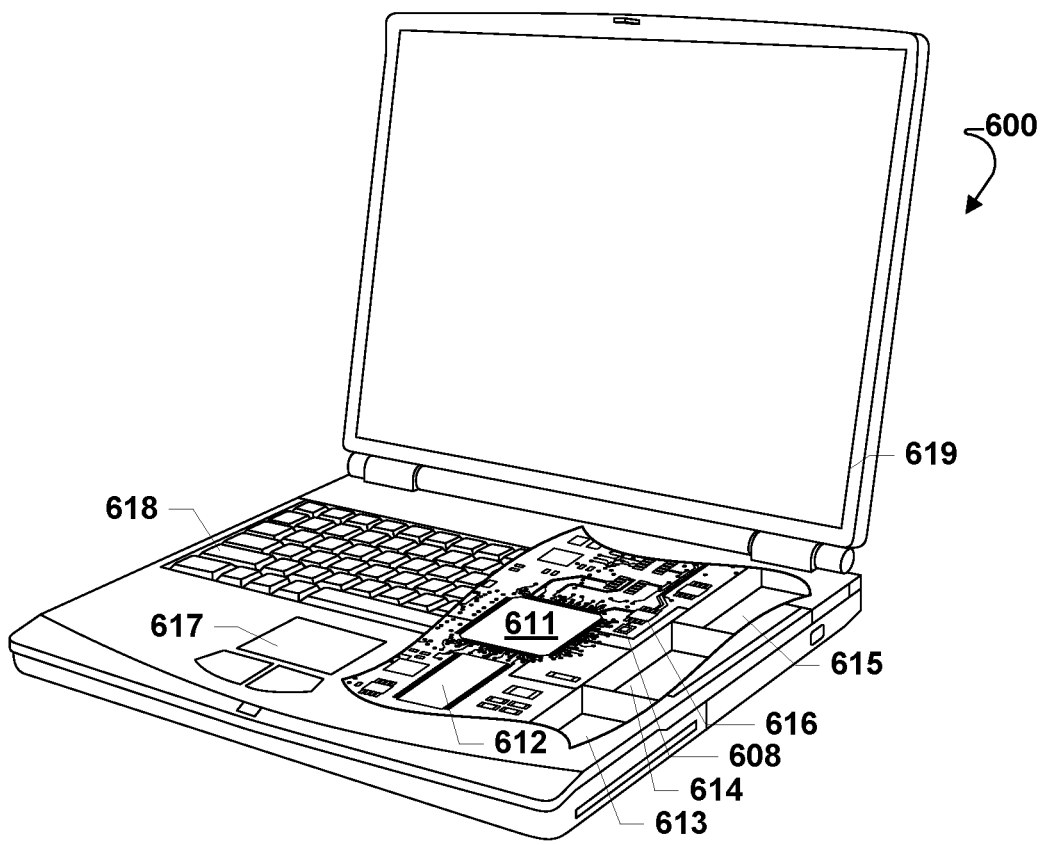
FIG. 6 is a component block diagram of an example computing device suitable for use with one or more embodiments of the present disclosure.

One or more of the embodiments described above may also be implemented within a variety of computing devices, such as a laptop computer 600 illustrated in FIG. 6. Many laptop computers include a touchpad touch surface 617 that serves as the computer's pointing device, and thus may receive drag, scroll, and flick gestures similar to those implemented on mobile computing devices equipped with a touch screen display and described above. A laptop computer 600 will typically include a processor 611 coupled to volatile memory 612 and a large capacity nonvolatile memory, such as a disk drive 613 of Flash memory. Other memories may also be coupled to the processor 611, such as flash drives and/or thumb drives connected via one or more ports (e.g., USB ports, etc.). Additionally or alternatively, the computer 600 may have one or more antennas 608 for sending and receiving electromagnetic radiation that may be connected to a wireless data link and/or cellular telephone transceiver 616 coupled to the processor 611. The computer 600 may also include a floppy disc drive 614, a compact disc (CD) drive 615, and other ports or drives (e.g., USB ports, memory card readers, etc.) coupled to the processor 611. In a notebook configuration, the computer housing includes the touchpad 617, the keyboard 618, and the display 619 all coupled to the processor 611. Other configurations of the mobile computing device may include a computer mouse or trackball coupled to the processor (e.g., via a USB input).

The processor 611 may be any programmable microprocessor, microcomputer or multiple processor chip or chips that can be configured by software instructions (applications) to perform a variety of functions, including the functions described with reference to the disclosed examples. In some devices, multiple processors may be provided, such as one processor dedicated to wireless communication functions and one processor dedicated to running other applications. Typically, software applications may be stored in the internal memory before they are accessed and loaded into the processor 611. The processor 611 may include internal memory sufficient to store the application software instructions. In many devices, the internal memory may be a volatile or nonvolatile memory, such as flash memory, or a mixture of both. For the purposes of this description, a general reference to memory refers to memory accessible by the processor 611 including internal memory or removable memory plugged into the device and memory within the processor 611 itself.

The foregoing method descriptions and the process flow diagrams are provided merely as illustrative examples and are not intended to require or imply that the steps of the various embodiments must be performed in the order presented. As will be appreciated by one of skill in the art, the order of steps in the foregoing embodiments may be performed in any order. Words such as "thereafter," "then," "next," etc. are not intended to limit the order of the steps; these words are simply used to guide the reader through the description of the methods. Further, any reference to claim elements in the singular, for example, using the articles "a," "an" or "the" is not to be construed as limiting the element to the singular.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The hardware used to implement the various illustrative logics, logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but, in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Alternatively, some steps or methods may be performed by circuitry that is specific to a given function.

In one or more exemplary aspects, the functions described may be implemented in hardware, software, firmware, or any combination thereof. If implemented in software, the functions may be stored as one or more instructions or code on a non-transitory computer-readable medium or non-transitory processor-readable medium. The steps of a method or algorithm disclosed herein may be embodied in a processor-executable software module and/or processor-executable instructions, which may reside on a non-transitory computer-readable or non-transitory processor-readable storage medium. Non-transitory server-readable, computer-readable or processor-readable storage media may be any storage media that may be accessed by a computer or a processor. By way of example but not limitation, such non-transitory server-readable, computer-readable or processor-readable media may include RAM, ROM, EPROM, FLASH memory, CD-ROM or other optical disk storage, magnetic disk storage or other magnetic storage devices, or any other medium that may be used to store desired program code in the form of instructions or data structures and that may be accessed by a computer. Disk and disc, as used herein, includes compact disc (CD), laser disc, optical disc, DVD, floppy disk, and Blu-ray disc where disks usually reproduce data magnetically, while discs reproduce data optically with lasers. Combinations of the above are also included within the scope of non-transitory server-readable, computer-readable and processor-readable media. Additionally, the operations of a method or algorithm may reside as one or any combination or set of codes and/or instructions on a non-transitory server-readable, processor-readable medium and/or computer-readable medium, which may be incorporated into a computer program product.

The preceding description of the disclosed embodiments is provided to enable any person skilled in the art to make or use the embodiments of the present disclosure. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A system, comprising:
   a detector configured to receive at least a portion of radiation output from a radiation source and output voltages in response to receiving the radiation;
   a temperature controller configured to adjust a temperature of the detector to a first temperature and to a second temperature; and
   an acquisition instrument configured to receive a first voltage output from the detector while the temperature of the detector is the first temperature and a second voltage from the detector output while the temperature of the detector is the second temperature, the acquisition instrument further configured to determine a wavelength and a power of the radiation source based at least in part on the first voltage and the second voltage.

2. The system of claim 1, wherein the radiation output from the radiation source is continuous wave, modulated, or pulsed monochromatic radiation.

3. The system of claim 1, wherein the radiation source is a laser.

4. The system of claim 1, wherein the first temperature is 20° C. and the second temperature is −15° C.

5. The system of claim 1, wherein the detector is an indium gallium arsenide (InGaAs) pin detector with a cutoff wavelength around 2.1-µm at the first temperature.

6. A system, comprising:
   a splitter configured to receive at least a portion of radiation output from a monochromatic radiation source and split the radiation into a first portion of radiation and a second portion of radiation;
   a first detector configured to receive the first portion of radiation from the splitter and output a first voltage in response to receiving the first portion of radiation;
   a first temperature controller configured to set a temperature of the first detector to a first temperature;
   a second detector configured to receive the second portion of radiation from the splitter and output a second voltage in response to receiving the second portion of radiation;
   a second temperature controller configured to set a temperature of the second detector to a second temperature, wherein the second temperature is different from the first temperature; and
   an acquisition instrument configured to receive the first voltage from the first detector while the temperature of the first detector is the first temperature and to receive the second voltage from the second detector while the temperature of the second detector is the second temperature, the acquisition instrument further configured to determine a wavelength and a power of the radiation output from the radiation source based at least in part on the first voltage and the second voltage.

7. The system of claim 6, wherein the radiation output from the radiation source is continuous wave, modulated, or pulsed monochromatic radiation.

8. The system of claim 6, wherein the radiation source is a laser.

9. The system of claim 6, wherein the temperature of the first detector is greater than or equal to +20° C. and the temperature of the second detector is less than or equal to −15° C.

10. The system of claim 6, wherein the first detector is an indium gallium arsenide (InGaAs) pin detector with a cutoff wavelength around 2.1-µm and the second detector is an InGaAs pin detector with a cutoff wavelength around 2.6-µm.

11. A method, comprising:
    receiving a first voltage and a second voltage output by one or more detectors in response to receiving radiation from a radiation source, wherein the first voltage is output by the one or more detectors at a first temperature and the second voltage is output by the one or more detectors at a second temperature, wherein the second temperature is different from the first temperature; and
    determining a wavelength and a power of the radiation from the radiation source based at least in part on the first voltage and the second voltage.

12. The method of claim 11, wherein the one or more detectors is one detector, the method further comprising:
    controlling temperature with a temperature controller to cause the one detector to have the first temperature and the second temperature while receiving the radiation from the radiation source.

13. The method of claim 12, wherein the first temperature is greater than or equal to 20° C. and the second temperature is less than or equal to −15° C.

14. The method of claim 13, wherein the one detector is an indium gallium arsenide (InGaAs) pin detector with a cutoff wavelength around 2.1-µm.

15. The method of claim 11, wherein the one or more detectors is a first detector and a second detector, the method further comprising:
    splitting the radiation from the radiation source such that a first portion of the radiation from the radiation source is incident on the first detector and a second portion of the radiation from the radiation source is incident on the second detector.

16. The method of claim 15, further comprising:
    controlling a temperature of the first detector to be the first temperature while outputting the first voltage; and
    controlling a temperature of the second detector to be the second temperature different from the first temperature while outputting the second voltage.

17. The method of claim 16, wherein the temperature of the first detector is greater than or equal to +20° C. and the temperature of the second detector is less than or equal to −15° C.

18. The method of claim 17, wherein the first detector is an indium gallium arsenide (InGaAs) pin detector with a cutoff wavelength around 2.1-µm and the second detector is an InGaAs pin detector with a cutoff wavelength around 2.6-µm.

19. The method of claim 11, wherein the radiation from the radiation source is continuous wave, modulated, or pulsed monochromatic radiation.

20. The method of claim 11, wherein the radiation source is a laser.

* * * * *